United States Patent [19]

Shibata et al.

[11] Patent Number: 5,371,373
[45] Date of Patent: Dec. 6, 1994

[54] ELECTRON BEAM LITHOGRAPHY METHOD AND APPARATUS SEPARATING REPETITIVE AND NON-REPETITIVE PATTERN DATA

[75] Inventors: Yukinobu Shibata, Ibaraki; Akira Hirakawa, Katsuta, both of Japan

[73] Assignee: Hitachi, Ltd., Tokyo, Japan

[21] Appl. No.: 152,958

[22] Filed: Nov. 16, 1993

[30] Foreign Application Priority Data

Nov. 30, 1992 [JP] Japan ................................ 4-320607

[51] Int. Cl.⁵ ............................................. H01J 37/04
[52] U.S. Cl. ................................ 250/492.22; 250/398
[58] Field of Search ............. 250/492.2, 492.23, 492.3, 250/492.22, 396 R, 398; 430/296

[56] References Cited

U.S. PATENT DOCUMENTS

| | | | |
|---|---|---|---|
| 4,213,053 | 7/1980 | Pfeiffer | 250/492 A |
| 5,036,209 | 7/1991 | Kataoka et al. | 250/492.2 |
| 5,082,762 | 1/1992 | Takahaski | 430/296 |
| 5,250,812 | 10/1993 | Murai et al. | 250/398 |
| 5,256,881 | 10/1993 | Yamazaki | 250/492.23 |

FOREIGN PATENT DOCUMENTS 4-148531 5/1992 Japan .

*Primary Examiner*—Paul M. Dzierzynski
*Assistant Examiner*—James Beyer
*Attorney, Agent, or Firm*—Kenyon & Kenyon

[57] ABSTRACT

Not only for a memory device having a high repeatability but also for a device having a low repeatability, there can be realized an electron beam lithography method which can carry out high speed processing of the device with a less number of lithography shots as well as an apparatus therefor. An input pattern is classified into repetitive and non-repetitive patterns. The classified non-repetitive pattern is further classified into unit areas, i.e., repetitive and no-repetitive unit patterns. Next, the non-repetitive unit patterns are converted into lithography data, while the repetitive unit patterns and repetitive patterns are composed on the lithography data of the non-repetitive unit patterns. A result of composing the repetitive unit patterns and repetitive patterns and the lithography data of the non-repetitive unit patterns is sorted according to a lithography sequence and output as the lithography data. Thus, the repetitive unit areas are extracted from the non-repetitive patterns and processed in the same manner as the repetitive patterns to thereby reduce the number of lithography shots.

9 Claims, 12 Drawing Sheets

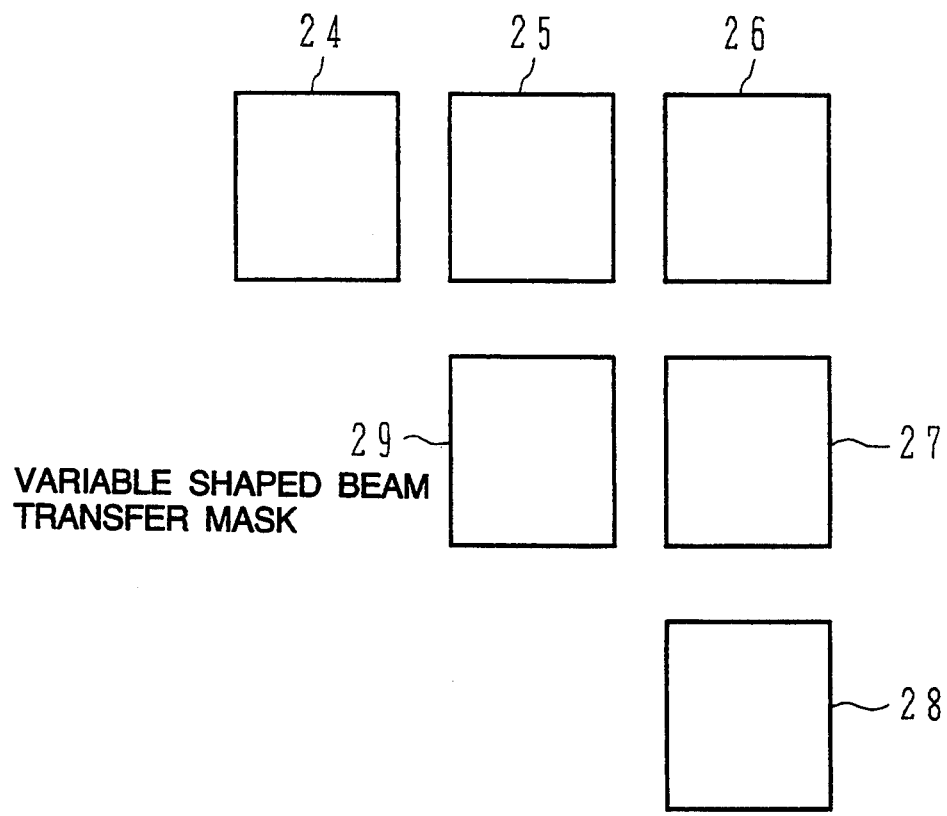

ELECTRON BEAM LITHOGRAPHY METHOD AND APPARATUS SEPARATING REPETITIVE AND NON-REPETITIVE PATTERN DATA

BACKGROUND OF THE INVENTION

The present invention relates to an electron beam lithography method which is used in a lithography process serving as a patterning process of a semiconductor device and an apparatus therefor.

For example, there has been proposed an electron beam lithography apparatus which can perform the patterning operation for a memory device with a high accuracy.

A lithography method used in the electron beam lithography apparatus is employed, in the case of fabricating an application specific integrated circuit (ASIC) or the like, as a direct writing technology for directly fabricating a device without using a mask or a mask lithography method for fabricating a mask itself. This electron beam lithography apparatus is suitable for accurate delineating or writing but is disadvantageous in that, when the apparatus is applied to fabrication of devices on a mass or volume production basis, its throughput is low unlike an optical aligner system. That is, since the electron beam lithography apparatus based on a variable shaped beam method requires to successively divide a device pattern to be written into rectangles and write the rectangles by using a variable shaped beam transfer mask. As a consequence, the number of necessary shots is remarkably increased and thus lots of time is required for processing.

In order to reduce the shot number in the electron beam lithography apparatus, there has been suggested a cell projection (one shot exposure lithography) method. In this method, noting the repeatability of devices, a cell as the repetitive pattern unit is used as a transfer mask and the transfer mask is used also as a variable shaped beam transfer mask, thereby reducing the shot number remarkably and increase a lithography throughput. One of such cell projection lithography technique is a pattern writing method as described, for example, in JP-A-4-148531.

SUMMARY OF THE INVENTION

In the aforementioned cell projection lithography technique, however, the repeatability of memory function elements or the like having an identical pattern is utilized. Accordingly, when this lithography technique is applied to devices having less-repetitive cells such as the aforementioned ASIC chips, a lithography shot number is increased remarkably and hence a lot of processing time is required. Further, since such a memory device as a DRAM is made to have a higher memory density of, e.g., 64M bits or 256M bits, even when the cell projection lithography technique is applied to the memory device, lots of lithography time is required.

For this reason, there have been demanded such an electron beam lithography method and an apparatus therefor which can reduce a lithography shot number and realize high-speed processing when the electron beam lithography technique is applied to a memory device of a high memory density or an ASIC device having less repetitive cells.

It is an object of the present invention, when it is desired to fabricate such a semiconductor device as, e.g., DRAM of 64M bits or more, to realize an electron beam lithography method and an apparatus therefor which can process not only a device having a high repeatability but also an ASIC device having a low repeatability with an decreased lithography shot number and at high speed.

In accordance with the present invention, a repetitive structure is semi-forcibly detected in a non-repetitive pattern and the detected repetitive structure is used to reduce a lithography shot number. To this end, the inventors of the present application notified that constant design rules are utilized in an ASIC pattern fabricating method. Though, in an ASIC pattern, some of function elements forming it are repetitively used, a repetitive pattern may not be detected in some cases due to wiring layers or overlapping with other layers. However, when attention is paid to an assembly of regular rectangle patterns called wide lines appearing on wiring layers or the like, the width of the rectangular patterns is constant due to their electron characteristics and their wiring interval is also constant. Further, although wiring lines have curved parts, the curved parts also have a regularity. The present invention has been constituted by noting and utilizing such constancy and regularity.

In accordance with an aspect of the present invention, there is provided an electron beam lithography method which includes the steps of classifying input data of patterns to be delineated into repetitive and non-repetitive patterns, selecting one of pre-registered unit patterns corresponding to the classified repetitive pattern, dividing the classified non-repetitive pattern into predetermined unit areas, classifying the divided unit areas into repetitive and non-repetitive unit areas, selecting one of pre-registered unit area patterns corresponding to the classified repetitive unit area, composing the selected unit patterns, the unit area patterns and the non-repetitive unit areas to form lithography data, and delineating the patterns on a lithography object on the basis of the lithography data.

It is preferable that the above electron beam lithography method further includes steps of judging whether or not the number of the classified repetitive patterns is larger than or equal to a predetermined repetition number, and further classifying the classified repetitive patterns as non-repetitive patterns when it is judged that the number of the classified repetitive patterns is smaller than the predetermined repetition number.

In the electron beam lithography method, the repetitive unit area corresponds preferably to a linear part of a wiring pattern. The linear part has a predetermined length.

In the electron beam lithography method, the repetitive unit area corresponds desirably to a corner part of a wiring pattern.

In accordance with another aspect of the present invention, there is provided an electron beam lithography apparatus which includes a lithography data preparation unit for classifying input data of the patterns to be delineated into repetitive and non-repetitive patterns, selecting one of pre-registered unit patterns corresponding to the classified repetitive pattern, dividing the classified non-repetitive pattern into predetermined unit areas, classifying the divided unit areas into repetitive and non-repetitive unit areas, selecting one of pre-registered unit area patterns corresponding to the classified repetitive unit area; a unit for composing the selected unit patterns, the unit area patterns and the non-repetitive unit areas to form a lithography data; and an electron beam control unit for controlling an electron beam to be irradiated onto a lithography object on the basis of the lithography data.

In the electron beam lithography apparatus, the lithography data preparation unit preferably judges whether or not the number of the classified repetitive patterns is larger than or equal to a predetermined repetition number, further classifying the classified repetitive patterns as non-repetitive patterns when it is judged that the number of the classified repetitive patterns is smaller than the predetermined repetition number.

In accordance with another aspect of the present invention, there is provided an electron beam lithography apparatus which includes a pattern selector for sorting input data of patterns to be delineated into repetitive and non-repetitive patterns, choosing one of pre-registered unit patterns corresponding to the repetitive pattern, dividing the non-repetitive pattern into predetermined unit areas, sorting the divided unit areas into repetitive and non-repetitive unit areas, choosing one of pre-registered unit area patterns corresponding to the sorted repetitive unit area; a lithography data generator for combining the chosen unit patterns, the unit area patterns and the non-repetitive unit areas to generate the lithography data; and an electron beam controller for controlling the electron beam to be irradiated onto the lithography object on the basis of the lithography data.

With respect to the patterns of the input data to be delineated classified as the repetitive patterns, unit patterns are employed for its delineation by using the cell projection technology. Further, the patterns of the input data to be delineated classified as the non-repetitive patterns are further divided into the unit areas. The divided unit areas are classified into the repetitive unit areas and the non-repetitive unit areas. The patterns classified as the repetitive unit areas are delineated by using the unit area patterns. Accordingly, the number of lithography shots can be remarkably reduce and delineating processing can be carried out at a high speed.

BRIEF DESCRIPTION OF THE DRAWINGS

FIG. 6 is a schematic diagram illustrating an example of layout of a second transfer mask used in the cell projection lithography method;

DESCRIPTION OF THE PREFERRED EMBODIMENTS

An electron beam lithography method and an apparatus therefor according to an embodiment of the present invention will be described with reference to the accompanying drawings.

Figure 3:
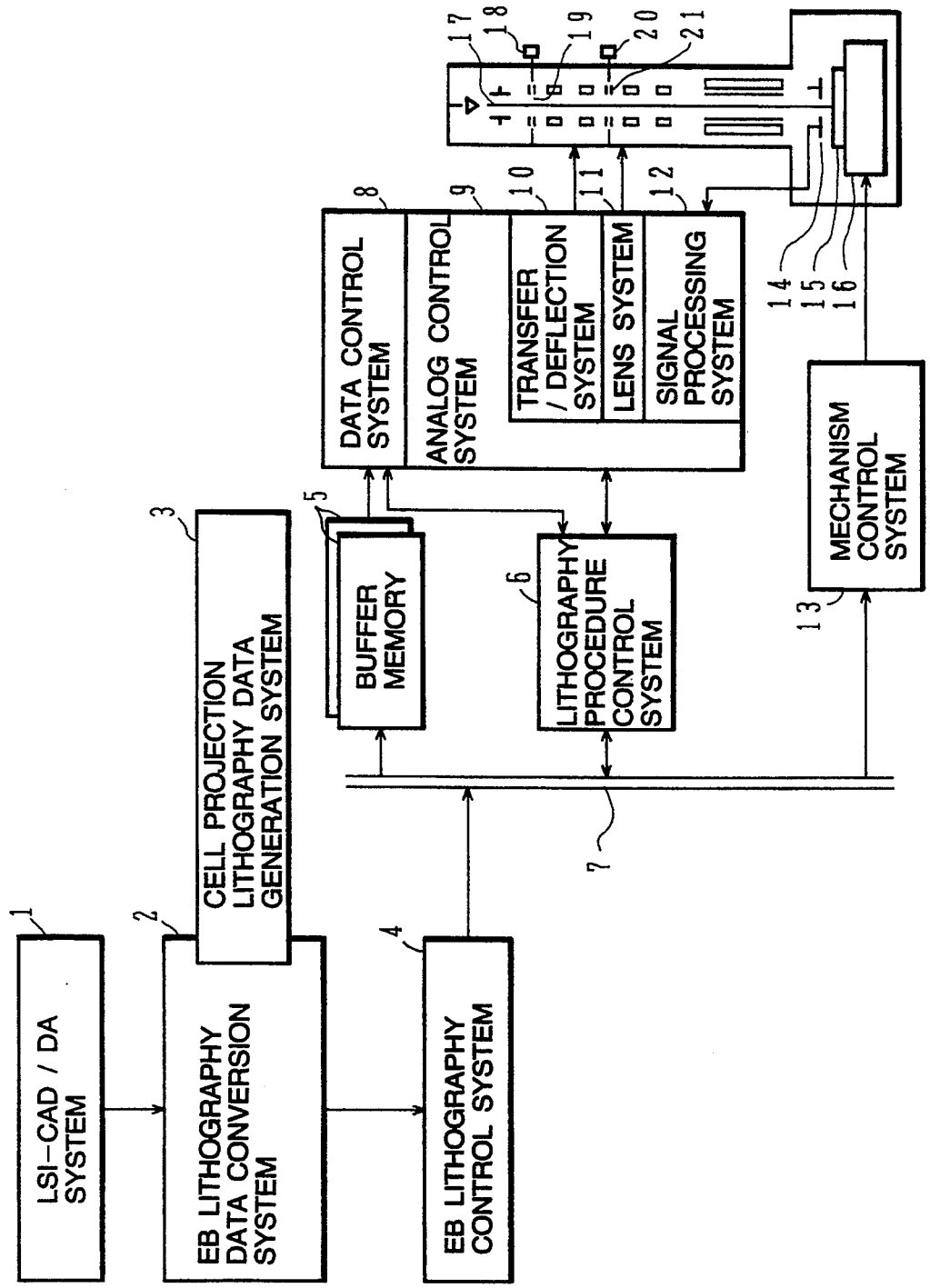
FIG. 3 is a schematic diagram showing an arrangement of an electron beam lithography apparatus embodying the electron beam lithography method according to the embodiment of the present invention.

Referring to FIG. 3, there is schematically shown an arrangement of an electron beam lithography apparatus embodying an electron beam lithography method in accordance with an embodiment of the present invention, in which case the electron beam lithography apparatus is used to write or delineate an LSI device pattern generated by an LSI-CAD/DA (computer-aided design/design automation) system 1.

In FIG. 3, an LSI device pattern is supplied from the LSI CAD/DA system 1 to an electron beam (EB) lithography data conversion system 2 as input data to be converted into data having such a format as readable by an EB lithography apparatus. If the input data represents such a repeated pattern (which is also called a cell in some LSI-CAD systems) as, for example, patterns of a memory device, then a cell projection lithography technique is utilized to perform efficient writing or delineating operation. In this case, the input data is processed by an EB lithography data generation system 3 of the cell projection lithography. The lithography data generated by the data conversion system 2 and the data generation system 3 (a lithography data generator and a pattern selector) is transferred to an EB lithography control system 4 and registered therein. Further, the repeated pattern processed by the EB lithography data generation system 3 of the cell projection lithography is generated as a second transfer mask 21 and installed in a second transfer mask mechanism 20.

After the lithography data for delineating and the second transfer mask 21 are generated in this way, the EB lithography control system 4 transfers the lithography data through a system bus 7 to a buffer memory 5 at a high speed. The buffer memory 5 is usually formed of two memory units so that while one of the memory units is receiving the lithography data through the system bus 7, the other of the memory units is transferring the lithography data to a data control system 8 at a high speed for the body of the apparatus in its delineating operation. The lithography data transferred to the data control system 8 is divided into shot patterns (which are usually rectangular in the variable shaped beam method) as minimum lithography units. When the lithography data is the cell projection data, a mask to be used is merely designated and the second transfer mask mechanism 20 is controlled by using the designated mask to thereby perform delineating operation. Further, in order to convert the shot patterns into a beam, the shot patterns are controlled and calibrated through a transfer/deflection system 10 and a lens system 11 in an analog control system 9 and then irradiated as a beam 17 onto an object 15 to be delineated. In this case, if the beam 17 is a variable shaped beam, the beam 17 is subjected to shaping operations by a first transfer mask 19 of the variable shaped beam installed in a first transfer mask mechanism 18 and by a mask (a mask 29 in FIG. 6) of the variable shaped beam in the second transfer masks 21 disposed in the second transfer mask mechanism 20. In the case of the cell projection lithography, masks 24 to 28 in FIG. 6 are used for shaping of the beam 17.

A signal processing system 12 receives a signal from a sensor 14 to monitor the state of the beam 17 and supplies a signal indicative of whether the beam 17 is normal or abnormal to the EB lithography control system 4. A mechanism control system 13 is provided to move the lithography object 15. A lithography procedure control system 6 controls the data control system 8 and the analog control system 9 at a high speed according to a lithography procedure command received from the EB lithography control system 4.

Figure 4:
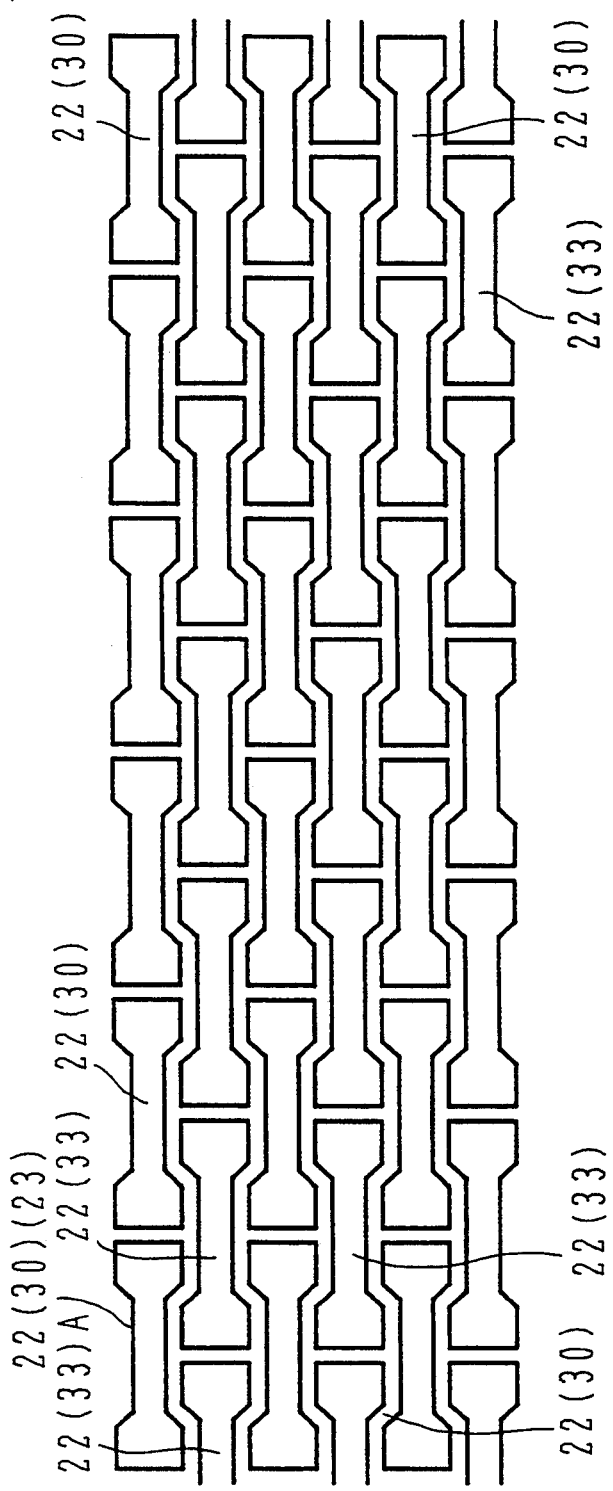
FIG. 4 is a schematic diagram illustrative of an example of repetitive unit patterns.
Figure 7:
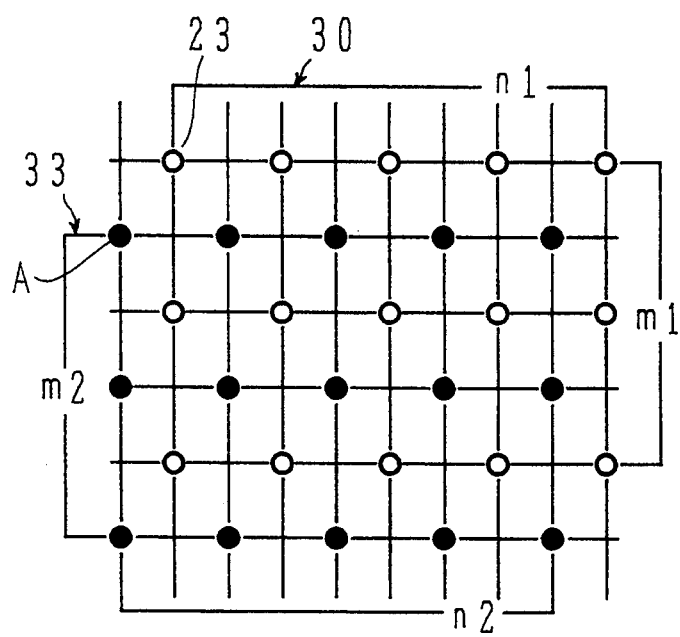
FIG. 7 is a schematic diagram for explaining a repetitive structure of a unit pattern.

FIG. 4 shows an example of repeated patterns seen in a memory device or the like. A repetitive unit pattern 22, as shown in FIG. 7, has a repetitive structure 30 (pattern 22 (30) shown in FIG. 4) with respect to an array reference point 23 serving as a start point (pattern 22(30)(23) in FIG. 4). Similarly, the repetitive unit pattern 22 has a repetitive structure 33 with respect to an array reference point A (pattern 22(33)A in FIG. 4). That is, in FIG. 4, the repetitive structure 30 includes the patterns 22 in the first, third and fifth rows; while the repetitive structure 33 includes the patterns 22 in the second, fourth and sixth rows. The repetitive structures 30 and 33 have the patterns of (n1×m1) and (n2×m2) as shown in FIG. 7, respectively. In the case of FIG. 7, n1, n2, m1 and m2 represent 5, 5, 3 and 3, respectively.

Figure 5A:
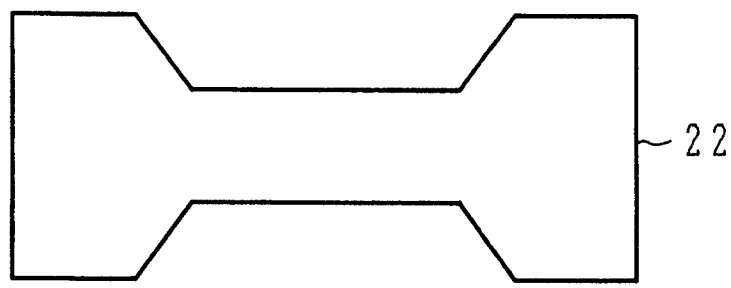
FIGS. 5A to 5C are schematic diagrams for explaining a cell projection lithography method and a variable shaped beam method.
Figure 5B:
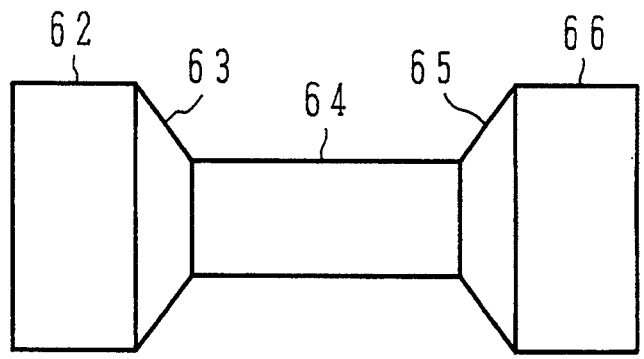
Figure 5C:
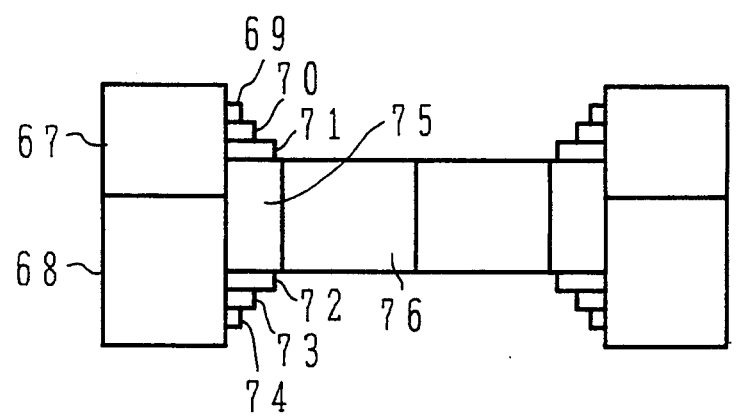

FIGS. 5A to 5C show diagrams for explaining increase in the shot patterns of the repetitive unit pattern 22 of FIG. 4. The increase of the shot patterns is a major cause of reducing a throughput. In FIGS. 5A to 5C, when the repetitive unit pattern 22 (FIG. 5A) is handled as lithography data of the variable shaped beam method, the unit pattern 22 is formed by five lithography patterns 62 to 66 (which are usually known as basic patterns and represented by a rectangle, a parallelogram and a trapezoid) as shown in FIG. 5B. These lithography patterns are divided by the data control system 8 in FIG. 3 into a number of shot patterns 67 to 76 as shown in FIG. 5C. When the repetitive unit pattern 22 is made in the form of a single mask, this requires merely a single shot pattern. Further, since the repetitive patterns are formed by the repetitive unit patterns 22, the lithography data can be compressed remarkably.

FIG. 6 shows an example of a layout of the second transfer masks 21 used in the cell projection lithography. The masks 24 to 28 are for the cell projection lithography, while the mask 29 is for the variable shaped beam method.

FIG. 7 is a diagram illustrating the repetitive structures 30 and 33 when only the repetitive structures 30 and 33 are extracted from the repetitive pattern example of FIG. 4. The repetitive structures 30 (having the patterns denoted by white dots) and 33 (having the patterns denoted by black dots) have array numbers of n1 and m1 in the X- and Y-axis direction and have array numbers of n2 and m2 in the X- and Y-axis direction, respectively.

Figure 8:
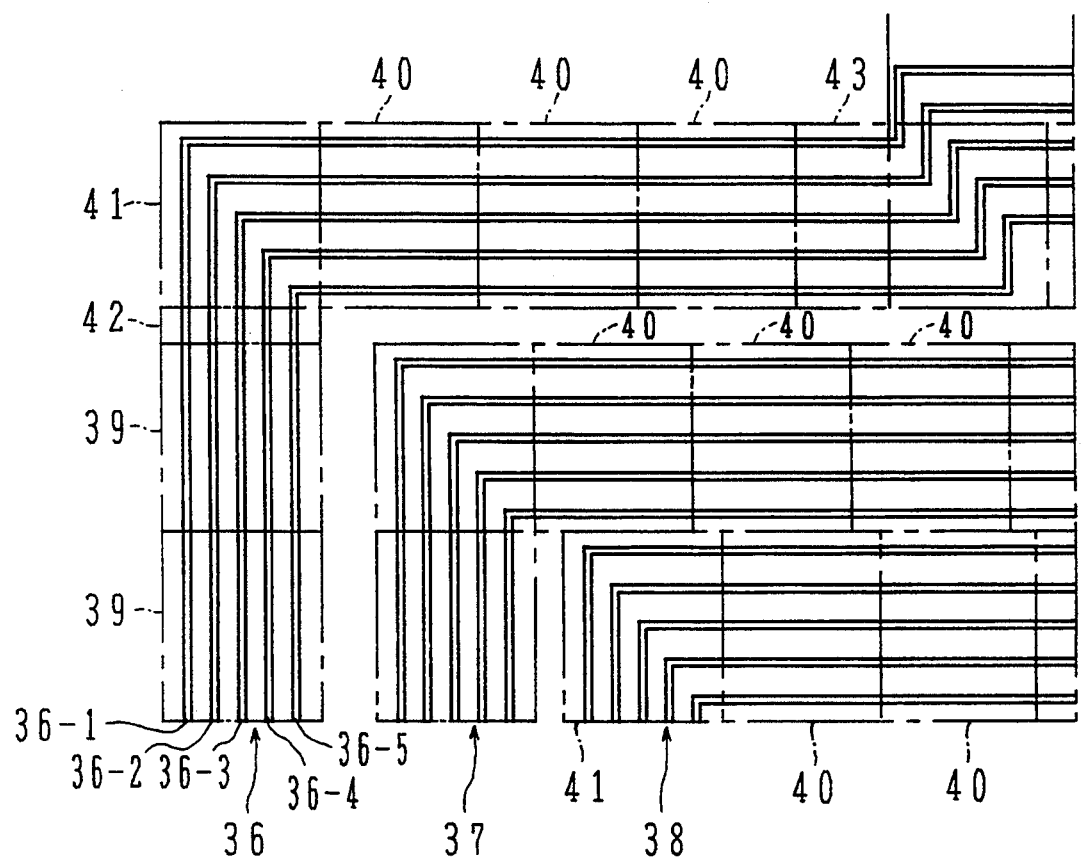
FIG. 8 is a schematic diagram showing an example of a wiring pattern divided into unit areas.
Figure 9:
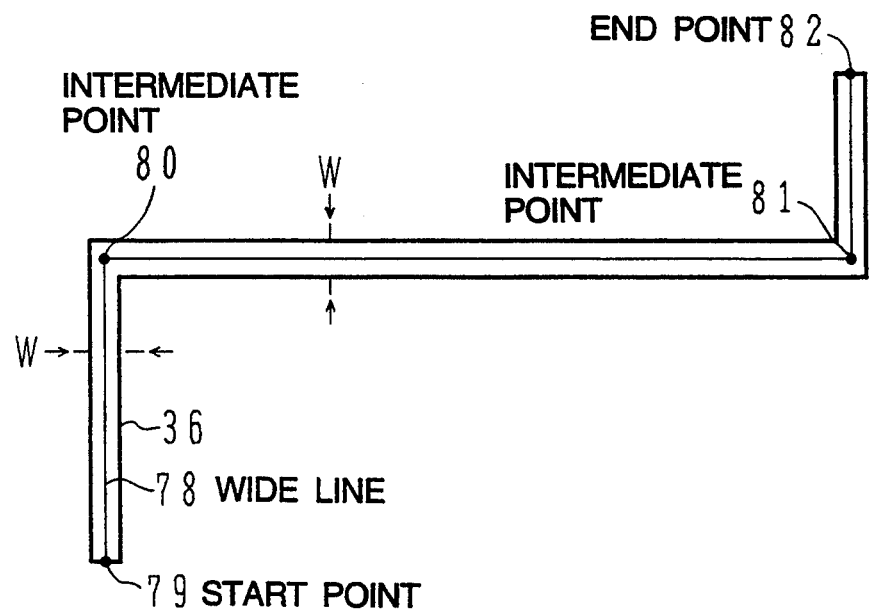
FIG. 9 is a schematic diagram illustrating an example of representation of a wide line.

FIG. 8 is an example of a wiring pattern which includes an assembly of wiring patterns 36, 37 and 38 which have topologically an identical value but geometrically different values. Thus, these patterns in the form of its input data could not be divided as cells in the prior art. The input data is represented by such a wide line 78 as shown in FIG. 9. Anyway, it is impossible in the prior art to find a repetitive structure from such a wide line.

When the wiring patterns are forcibly divided, for example, into cell projection unit areas 39 and 40, a repetitive structure can be find. This is because wiring lines 36—1 to 36—5 constituting the cell projection unit areas 39 and 40 of the wiring patterns 36, for example, are arranged with an equal distance thereamong according to the design rules of the LSI-CAD/DA system 1, so that the repetitive pattern can be extracted.

From the above consideration, it will be appreciated that, with respect to the repetitive structures of the wiring pattern 36, the two cell projection unit areas 39 are arranged in the vertical direction in the drawing while the three cell projection unit areas 40 are arrange in the horizontal direction in the drawing. Meanwhile, with respect to the repetitive structures of the wiring pattern 37, the three unit areas 40 are arranged in the horizontal direction; whereas, with respect to the repetitive structures of the wiring pattern 38, the two unit areas 40 are arranged in the horizontal direction. Assuming that a shot number required for each of the cell projection unit areas 39, 40 is 10, in the case of the variable shaped beam lithography, a total of 100 shots are required in order to delineate the entire repetitive structures of the cell projection unit ares 39 and 40 because there are the eight unit areas 40 and the two unit areas 39. In contrast, in the case of the cell projection lithography, the entire structures of the cell projection unit areas 39 and 40 can be delineated by using only ten shots. Meanwhile, non- cell projection unit areas 41, 42, 43 etc. which are non-repetitive patterns can not be converted into lithography data according to the prior art method.

FIG. 9 shows an example of the wide line 78. The wide line 78 in the form of an input data is expressed by a start point 79 as a reference point, intermediate points 80 and 81, an end point 82 and a line width 'w', and the substantial wiring pattern 36 is not present. However, when the input data is converted into EB lithography data, it is reproduced as the substantial wiring pattern. According to the present invention, attention is paid, e.g., to a length of the wide line between the intermediate points 80 and 81 and the length is divided into a suitable number of cell projection unit areas.

Figure 10:
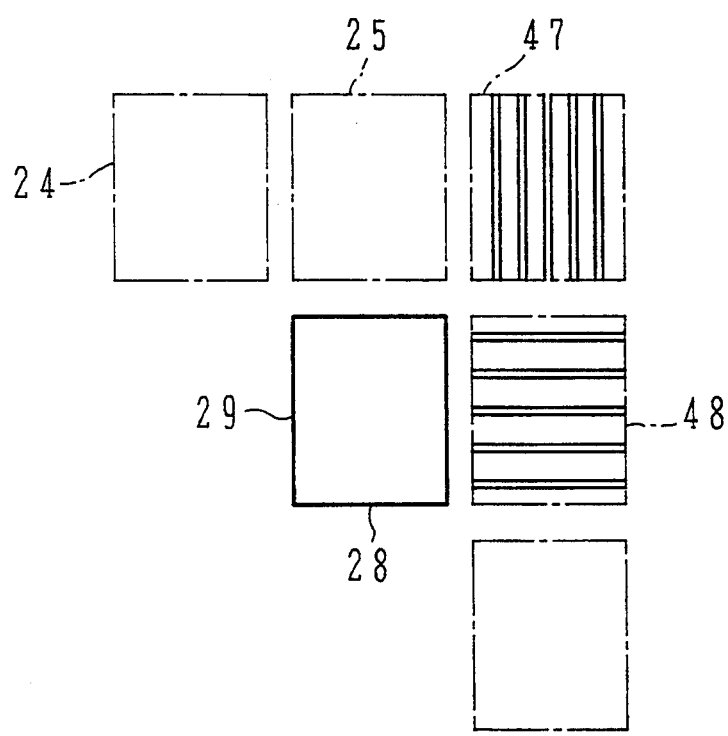
FIG. 10 is a schematic diagram showing an example of layout of a mask for the repeated unit areas of FIG. 8.

FIG. 10 shows an example of layout in which mask patterns 47 and 48 according to the present invention are applied to the masks 26 and 27 of the mask layout of FIG. 6. These mask patterns 47 and 48 correspond to the unit areas 39 and 40 of FIG. 8 respectively.

Figure 1:
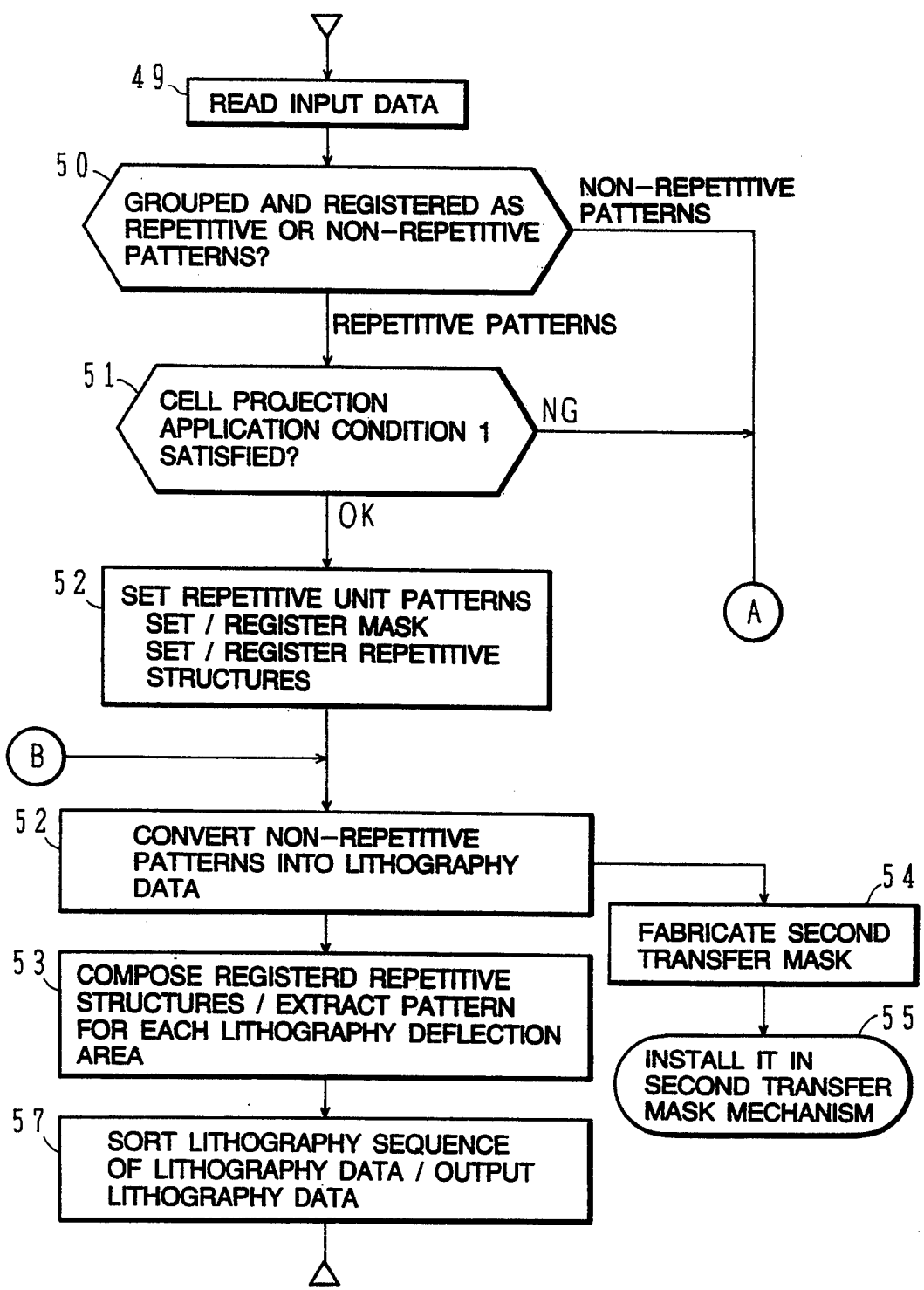
FIG. 1 is a flow chart for explaining the general operation of an electron beam lithography method in accordance with an embodiment of the present invention.

FIG. 1 is a flowchart for explaining the general lithography data converting operation of an electron beam lithography method in accordance with the embodiment of the present invention. The following operations to be explained below are executed by the EB lithography data conversion system 2 and the cell projection lithography data generation system 3. In step 49 of FIG. 1, LSI pattern data is read and input from the LSI-CAD/DA system 1. In the next step 50, the input data is classified into repetitive patterns or non-repetitive patterns based on the cell name and array structure of the input pattern data and previously temporarily registered. In the case of the non-repetitive patterns, the processing proceeds to a processing A in FIG. 2.

When the input data is classified as the repetitive patterns in step 50, the processing proceeds to step 51, where it is determined whether or not a cell projection condition 1 is satisfied. The cell projection condition 1 is such that the repetitive numbers of the repetitive patterns is sufficiently large and the cell size is not more than the mask size, or the mask has a fabricatable shape. When it is determined that the above condition 1 is not satisfied in step 51, the processing proceeds to A in FIG. 2. If it is determined that the above condition 1 is satisfied in step 51, the processing proceeds to step 52, in which a repetitive unit pattern (also known as a cell) for fabrication of the second transfer mask 21 is set and then the processing proceeds to step 54. In step 54, a preparing operation (mask layout and lithography data conversion) of the second transfer mask is carried out and the mask is set in the second transfer mask mechanism 20 in step 55. In this respect, once the preparing and setting operations of the mask are completed in steps 54 and 55, these steps is omitted in the succeeding procedures.

In step 52, the repetitive unit pattern mask is thus set and the repetitive structure is simultaneously set, and then they are registered. Then, the processing proceeds to step 53, whereat the non-repetitive patterns temporally registered are extracted in step 50 and the extracted patterns are subjected to a normal lithography data conversion. At the same time, the non-repetitive patterns set during the processing of FIG. 2 (which will be explained later) are processed in step 53. Then, the processing proceeds to step 56, where the mask and repetitive structure registered in step 52 are selected and composed with the lithography data of the non-repetitive pattern obtained in step 53. Thereafter, these lithography data are again pattern-divided and extracted for each lithography deflection area. Next, the processing proceeds to step 57, where the lithography data obtained in step 56 is sorted according to the lithography sequence and output as lithography data.

Figure 2:
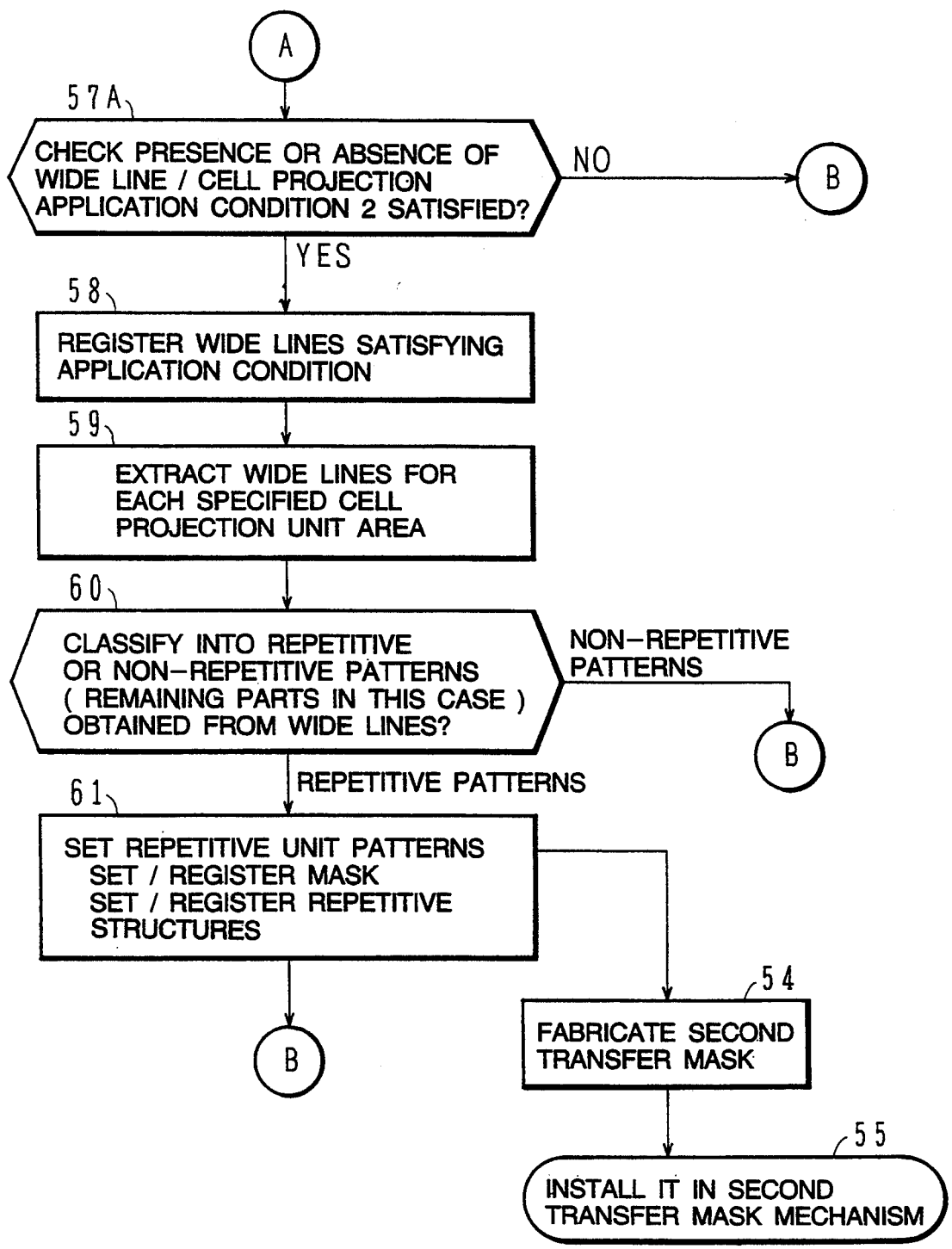
FIG. 2 is a flow chart for explaining the operation of the method branched from the flow chart of FIG. 1.

FIG. 2 is a flowchart for explaining part of the operation of the embodiment of the present invention, that is, the operation branched from the flowchart of FIG. 1, wherein repetitive structures are generated by forcibly extracting the divided cell projection unit areas. A in FIG. 2 indicates a branch from the flowchart of FIG. 1.

In step 57A of FIG. 2, it is checked whether a wide line is present or absent in the input data having been classified as the non-repetitive patterns in steps 50 and 51. At the same time, it is determined whether nor not the input data satisfies a cell projection application condition 2. The application condition 2 is that the number of wide lines belonging to the cell projection unit area is sufficiently high, the widths of the wire lines are all the same, the array and interval of the wide lines are identical, and the length of the wide lines is sufficiently larger than the lengths in the all directions of the cell projection unit area. When the above application condition 2 is not satisfied, the processing returns to a root B in FIG. 1. If it is determined that the above application condition 2 is satisfied in step 57A, the processing proceeds to step 58, at which the wide lines are registered. Then, the processing proceeds to step 59, where the wide lines are extracted for each of the pre-assigned cell projection unit areas. The extracted processing is performed as shown in FIG. 8.

Then, the processing further proceeds to step 60 from the step 59, whereat the extracted wide lines are classified into newly obtained repetitive unit patterns and remaining parts other than the repetitive unit patterns. When the extracted wide lines are classified as the non-repetitive unit area patterns, the processing is returned to the root B in FIG. 1. Meanwhile, when the extracted wide lines are classified as the repetitive unit patterns, the processing proceeds to step 61 where a repetitive unit area pattern (also Galled a cell) for fabrication of the second transfer mask 21 is set, then the processing proceeds to steps 54 and 55. In step 61, a mask of the set repetitive unit area pattern and repetitive structures are simultaneously set and then registered. Thereafter, the processing is returned from step 61 to the root B of FIG. 1.

Figure 11:
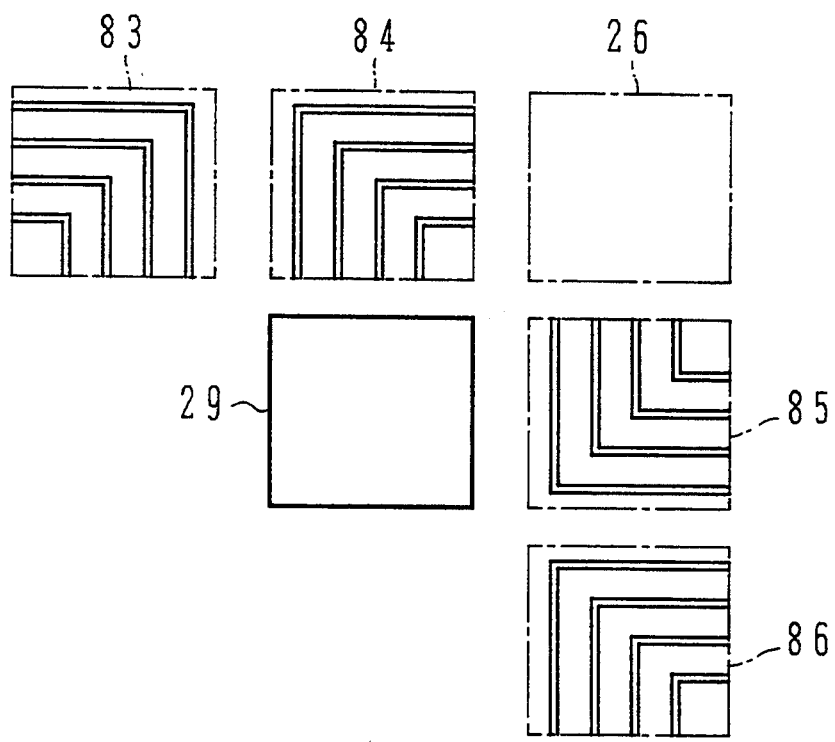
FIG. 11 is a schematic diagram showing another example of layout of the mask for the repeated unit areas.

FIG. 11 shows another example of the mask pattern layout. Although attention has been paid to the linear parts of the wiring pattern (wide lines) in the example of FIG. 10, attention is paid to the corner parts of the wiring pattern in the example of FIG. 11. That is, in the mask patterns 83 to 86, four corner parts bent at a right angle in four directions are utilized. For example, the unit area 41 having corner parts in FIG. 8 corresponds to the mask pattern 86 in FIG. 11. There frequently occur such cases that corner parts are utilized as mask patterns.

Figure 12:
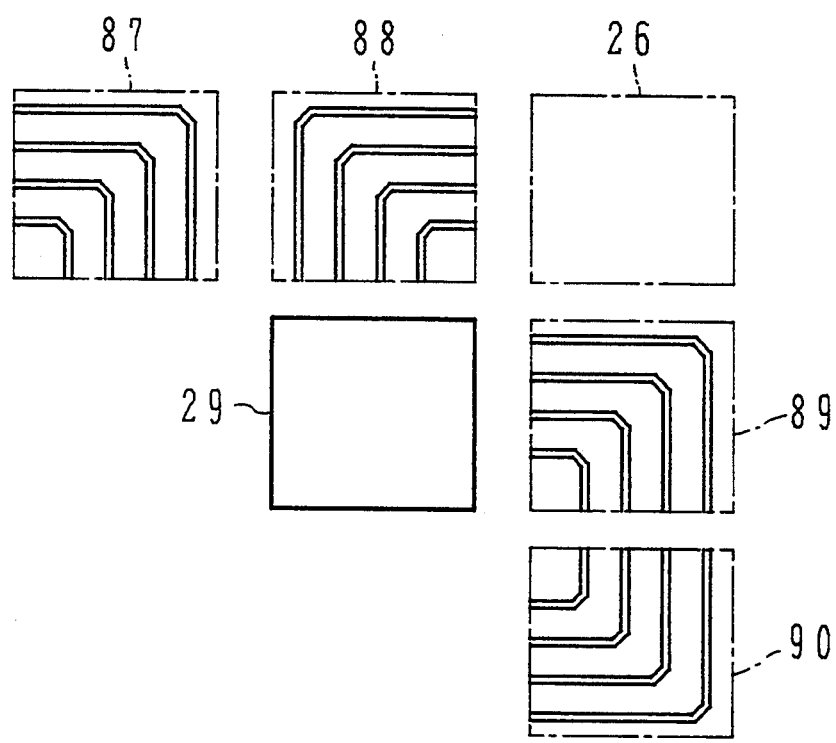
FIG. 12 is a schematic diagram showing a further example of layout of the mask for the repetitive unit areas.

FIG. 12 is still another example of the mask pattern layout. In the example of FIG. 12, like the example of FIG. 11, corner parts of wide lines are utilized but the corner parts are bent at an angle of 45 degrees. Each of mask patterns 87 to 90 has four corner parts bent in four directions. As yet another example, the corner parts of the mask patterns in the example of FIG. 12 are considered to have a curved shape.

Figure 13:
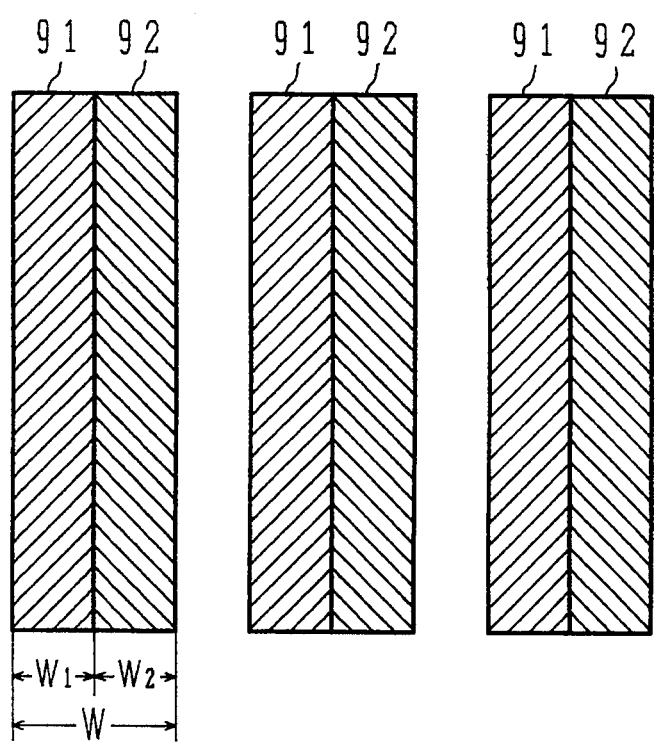
FIG. 13 is a schematic diagram showing an example when a line width is subjected to a mask patterning.

FIG. 13 is an example when the line width of a pattern is utilized as a mask pattern. The example of FIG. 13 is especially effective when the invention is applied to a number of wiring patterns having lines of an identical line width. Further, the present example is effective when the invention is applied to wiring patterns having lines of line widths exceeding the maximum dimension of a variable shaped beam transfer mask. More specifically, when the line width W exceeds the above maximum dimension, a mask pattern 91 having a line width W1 can be combined with a mask pattern 92 having a line width W2 to form a mask pattern having the line width W. Accordingly, when mask patterns having a plurality of sorts of line widths Wi are prepared, the invention can cope with a number of sorts of line widths W.

Since the present invention is arranged as already explained in the foregoing, the invention has the following technical advantages.

That is, according to the present invention, there is provided an electron beam lithography method which includes the steps of classifying input data into repetitive and non-repetitive patterns, selecting one of pre-registered unit patterns corresponding to the classified repetitive pattern, dividing the classified non-repetitive pattern into predetermined unit areas, classifying the divided unit areas into repetitive and non-repetitive unit areas, selecting one of pre-registered unit area patterns corresponding to the classified repetitive unit area, composing the selected unit patterns, the unit area patterns and the non-repetitive unit areas to form a lithography data, and delineating a predetermined pattern on a lithography object on the basis of the lithography data. Therefore, there can be realized an electron beam lithography method which can remarkably reduce the number of electron beam lithography shots and can carry out high-speed delineating operation.

Further, according to the present invention, there is provided an electron beam lithography apparatus which includes a lithography data preparation unit for classifying input data into repetitive and non-repetitive patterns, for selecting one of pre-registered unit patterns corresponding to the classified repetitive pattern, for dividing the classified non-repetitive pattern into predetermined unit areas, for classifying the divided unit areas into repetitive and non-repetitive unit areas, and for selecting one of pre-registered unit area patterns corresponding to the classified repetitive unit area, a unit for composing the selected unit patterns, unit area patterns and non-repetitive unit areas to form a lithography data, and an electron beam control unit for controlling an electron beam to be irradiated onto a lithography object on the basis of the lithography data. Therefore, there can be realized an electron beam lithography apparatus which can remarkably reduce the number of electron beam lithography shots and can carry out high-speed delineating operation.

What is claimed is:

1. An electron beam lithography method for irradiating an electron beam onto a lithography object to delineate patterns thereon, comprising the steps of:
   classifying input data of patterns to be delineated into repetitive and non-repetitive patterns;
   selecting one of pre-registered unit patterns corresponding to said classified repetitive pattern;
   dividing said classified non-repetitive pattern into predetermined unit areas;
   classifying said divided unit areas into repetitive and non-repetitive unit areas;
   selecting one of pre-registered unit area patterns corresponding to said classified repetitive unit area;
   composing said selected unit patterns, said unit area patterns and said non-repetitive unit areas to form lithography data; and
   delineating patterns on said lithography object on the basis of said lithography data.

2. An electron beam lithography method according to claim 1, further comprising the steps of,
   judging whether or not the number of said classified repetitive patterns is larger than or equal to a predetermined repetition number, and
   further classifying said classified repetitive patterns as non-repetitive patterns when it is judged that the number of said classified repetitive patterns is smaller than said predetermined repetition number.

3. An electron beam lithography method according to claim 1, wherein said repetitive unit area corresponds to a linear part of a wiring pattern, said linear part having a predetermined length.

4. An electron beam lithography method according to claim 1, wherein said repetitive unit area corresponds to a corner part of a wiring pattern.

5. An electron beam lithography apparatus for irradiating an electron beam onto a lithography object to delineate patterns thereon, comprising:
   lithography data preparation means for classifying input data of patterns to be delineated into repetitive and non-repetitive patterns, selecting one of pre-registered unit patterns corresponding to said classified repetitive pattern, dividing said classified non-repetitive pattern into predetermined unit areas, classifying said divided unit areas into repetitive and non-repetitive unit areas, selecting one of pre-registered unit area patterns corresponding to said classified repetitive unit area;
   means for composing said selected unit patterns, said unit area patterns and said non-repetitive unit areas to form said lithography data; and
   electron beam control means for controlling said electron beam to be irradiated onto said lithography object on the basis of said lithography data.

6. An electron beam lithography apparatus according to claim 5, wherein said lithography data preparation means judges whether or not the number of said classified repetitive patterns is larger than or equal to a predetermined repetition number, further classifying said classified repetitive patterns as non-repetitive patterns when it is judged that the number of said classified repetitive patterns is smaller than said predetermined repetition number.

7. An electron beam lithography apparatus for irradiating an electron beam onto a lithography object to delineate patterns thereon, comprising:
   a pattern selector for sorting input data of patterns to be delineated into repetitive and non-repetitive patterns, choosing one of pre-registered unit patterns corresponding to said repetitive pattern, dividing said non-repetitive pattern into predetermined unit areas, sorting said divided unit areas into repetitive and non-repetitive unit areas, choosing one of pre-registered unit area patterns corresponding to said sorted repetitive unit area;
   a lithography data generator for combining said chosen unit patterns, said unit area patterns and said non-repetitive unit areas to generate said lithography data; and
   an electron beam controller for controlling said electron beam to be irradiated onto said lithography object on the basis of said lithography data.

8. An electron beam lithography method according to claim 2, wherein said repetitive unit area corresponds to a linear part of a wiring pattern, said linear part having a predetermined length.

9. An electron beam lithography method according to claim 2, wherein said repetitive unit area corresponds to a corner part of a wiring pattern.

* * * * *

UNITED STATES PATENT AND TRADEMARK OFFICE
CERTIFICATE OF CORRECTION

PATENT NO. : 5,371,373

DATED : 6 December 1994

INVENTOR(S) : Yukinobu SHIBATA et al.

It is certified that error appears in the above-indentified patent and that said Letters Patent is hereby corrected as shown below:

IN THE ABSTRACT, line 9: Change "no-repetitive" to --non-repetititve--.

| Column | Line | |
|---|---|---|
| 1 | 25 | Change "That" to --This occurs--. |
| 1 | 26 | Change "is, since" to --because--. |
| 1 | 27 | Change "requires" to --is required--. |
| 1 | 31 | Change "lots" to --a lot--. |
| 1 | 40 | Change "increase" to --increasing--. |
| 1 | 41 | Change "technique" to --techniques--. |
| 2 | 9 | Change "notified" to --noted--. |
| 2 | 11 | After "of" insert --the--. |

UNITED STATES PATENT AND TRADEMARK OFFICE
CERTIFICATE OF CORRECTION

PATENT NO. : 5,371,373
DATED : 6 December 1994
INVENTOR(S) : Yukinobu SHIBATA et al.

It is certified that error appears in the above-indentified patent and that said Letters Patent is hereby corrected as shown below:

| Column | Line | |
|---|---|---|
| 3 | 39 | Change "reduce" to --reduced--. |
| 3 | 67 | Change "repeated" to --repetitive--. |
| 4 | 2 | Change "repeated" to --repetitve--. |
| 6 | 7 | Change "find" to --found--. |
| 6 | 17 | Change "arrange" to --arranged--. |
| 6 | 28 | Change "ares" to --areas--. |
| 7 | 14 | After "mask" insert --21--. |
| 7 | 18 | Change "is" to --are--. |
| 7 | 54 | Change "in the all" to --in all--. |
| 7 | 64 | Delete "from". |
| 7 | 65 | Delete "the step 59". |

UNITED STATES PATENT AND TRADEMARK OFFICE
CERTIFICATE OF CORRECTION

PATENT NO.  : 5,371,373
DATED       : 6 December 1994
INVENTOR(S) : Yukinobu SHIBATA et al.

It is certified that error appears in the above-indentified patent and that said Letters Patent is hereby corrected as shown below:

| Column | Line |  |
|--------|------|--|
| 8 | 5 | Change "Galled" to --called--. |
| 8 | 23 | Change "still" to --yet--. |

Signed and Sealed this

Thirtieth Day of May, 1995

Attest:

BRUCE LEHMAN

Attesting Officer

Commissioner of Patents and Trademarks